(12) United States Patent
Alur et al.

(10) Patent No.: US 10,727,184 B2
(45) Date of Patent: Jul. 28, 2020

(54) MICROELECTRONIC DEVICE INCLUDING NON-HOMOGENEOUS BUILD-UP DIELECTRIC

(71) Applicant: Intel Corporation, Santa Clara, CA (US)

(72) Inventors: Siddharth K. Alur, Chandler, AZ (US); Srinivas V. Pietambaram, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/145,683

(22) Filed: Sep. 28, 2018

(65) Prior Publication Data
US 2020/0105673 A1    Apr. 2, 2020

(51) Int. Cl.
| | |
|---|---|
| H01L 23/532 | (2006.01) |
| H01L 21/768 | (2006.01) |
| H01L 23/522 | (2006.01) |
| H01L 23/498 | (2006.01) |
| H01L 25/065 | (2006.01) |
| H01L 21/02 | (2006.01) |
| H01L 23/00 | (2006.01) |

(52) U.S. Cl.
CPC .... *H01L 23/5329* (2013.01); *H01L 21/02115* (2013.01); *H01L 21/76874* (2013.01); *H01L 23/49894* (2013.01); *H01L 23/5226* (2013.01); *H01L 23/53276* (2013.01); *H01L 24/33* (2013.01); *H01L 25/0655* (2013.01); *H01L 2224/024* (2013.01); *H01L 2224/02379* (2013.01)

(58) Field of Classification Search
CPC ............. H01L 23/5226; H01L 23/5329; H01L 23/53295; H01L 23/5383; H01L 2224/02331; H01L 2224/02379; H01L 2224/0239; H01L 2224/024
See application file for complete search history.

(56) References Cited

U.S. PATENT DOCUMENTS

| | | | | |
|---|---|---|---|---|
| 2003/0042605 | A1* | 3/2003 | Andideh | H01L 21/02126 257/741 |
| 2004/0089924 | A1* | 5/2004 | Yuasa | H01L 21/02126 257/673 |
| 2020/0075473 | A1* | 3/2020 | Pietambaram | H01L 23/145 |

* cited by examiner

*Primary Examiner* — Robert G Bachner
*Assistant Examiner* — Molly K Reida
(74) *Attorney, Agent, or Firm* — Schwegman Lundberg & Woessner, P.A.

(57) ABSTRACT

Described are example microelectronic devices including structures, such as build-up layers, formed of a non-homogeneous photoimageable dielectric material. The non-homogeneous photoimageable dielectric material includes two regions forming opposite surfaces of the material. A first region includes a first carbon content, and a second region located above the first region includes a second carbon content which is greater than that of the first region. The second region of the photoimageable dielectric material provides enhanced adhesion with metal that may be deposited above the material, such as a sputtered metal seed layer to facilitate subsequent deposition of an electroless metal over the non-homogeneous photoimageable dielectric material.

12 Claims, 5 Drawing Sheets

MICROELECTRONIC DEVICE INCLUDING NON-HOMOGENEOUS BUILD-UP DIELECTRIC

TECHNICAL FIELD

Embodiments described herein relate generally to photoimageable dielectric materials and their use in forming microelectronic devices, and more particularly relate to non-homogeneous photoimageable dielectric material, having differing compositions at opposing surfaces to improve metal bonding to the photoimageable dielectric material and the resulting manufactured devices.

BACKGROUND

Many forms of microelectronic devices, such as IC (integrated circuit) packages, include a semiconductor package substrate or similar structure (such as a redistribution layer ("RDL"), interposer, etc.). All of such structures are generically referred to herein as "substrates" for purposes of the present disclosure. In many examples, manufacturing such substrates includes forming one or more build-up layers over an underlying structure (such as a substrate core, a semiconductor die, reconstituted wafer, etc.). Such build-up layers commonly include a dielectric, with a conductive material extending over the dielectric and forming contacts through the dielectric (such as micro-vias) to a conductive structure below (such as another conductive layer, a contact pad, through core contact, etc.).

In the forming of such substrates, it is often desirable to form the conductive structures through electroless deposition of the metal conductor (and via) material. Such electroless deposition, however, may require deposition of a seed layer upon which the electroless metal can be deposited. In many examples, the seed layer is sputtered onto the patterned build-up dielectric material, and the electroless metal is deposited to form the conductive layer and vias.

Photoimageable dielectric film ("PID") offers many advantages in forming structures such as build-up layers. However, conventional photoimageable dielectric film presents challenges relative to adhesion of metallic materials, such as metal seed layers, to the films.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present description addresses example structures for use in forming microelectronic devices, described in reference to examples of forming of build-up layers for substrates. The example structures include new forms of PID having a non-homogeneous composition to provide a surface offering improved adhesion to metal layers formed thereon, which is of particular advantage for adhesion of relatively thin seed layers as are commonly used for electroless deposition.

In some examples, the non-homogeneous composition of a PID may be in the form of a surface treatment of a film, or other modification of an upper region of the material, that will subsequently be used in forming, for example, build-up layers. In other examples, the non-homogeneous PID film may be formed by a surface treatment applied in the course of substrate manufacture. Additional options for forming the non-homogeneous PID will be discussed later herein.

Figure 1:
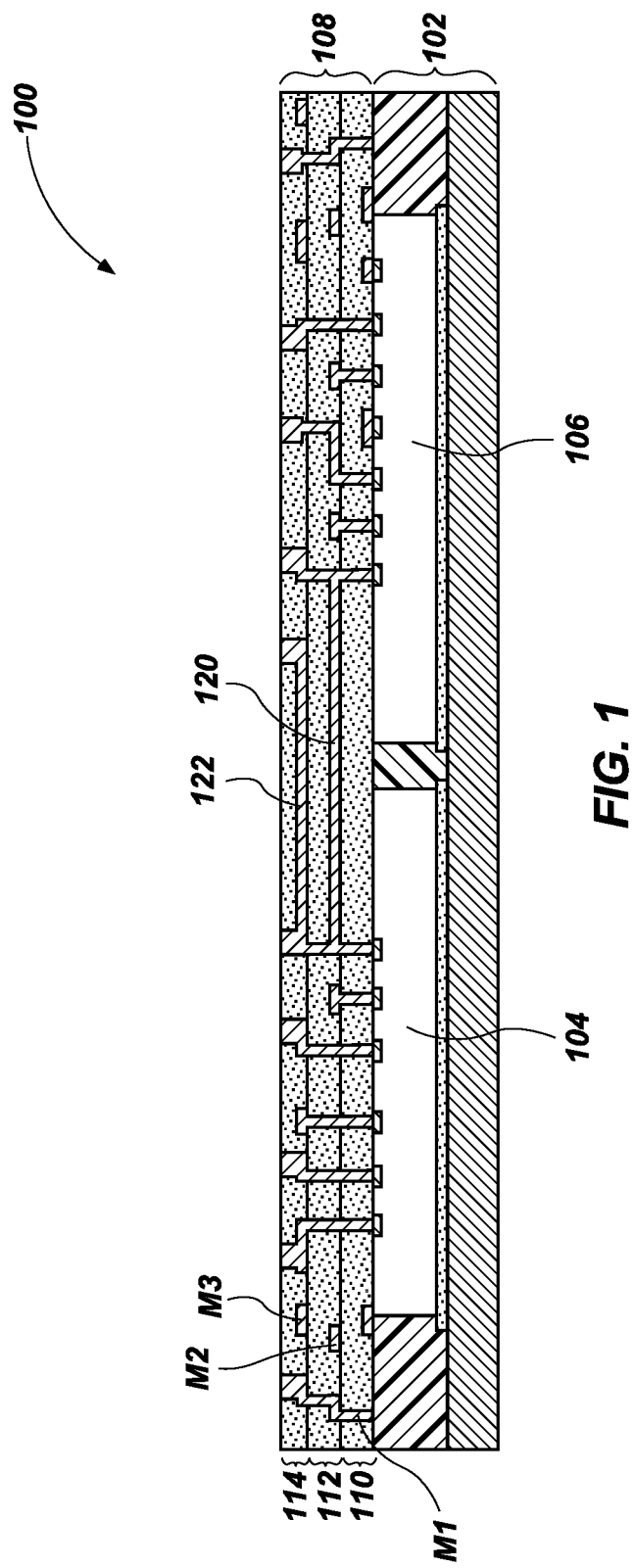
FIG. 1 depicts a simplified cross-sectional representation of a portion of a microelectronic device substrate incorporating multiple build-up layers as described in more detail later herein.

Referring now to FIG. 1, the figure depicts a simplified cross-sectional representation of a portion of an example microelectronic device, in the form of a multichip package ("MCP") 100. The represented portion of multichip package 100 includes a reconstituted wafer, indicated generally at 102, including two semiconductor die 104, 106, with an RDL indicated, generally at 108, formed over reconstituted wafer 102.

RDL 108 includes three build-up layers, indicated generally at 110, 112, 116, with each build-up layer supporting a respective metal layer M1, M2, M3. Metal layers M1, M2, M3 collectively form conductive traces and interconnects (commonly in the form of conductive micro-vias) to redistribute the contacts of the semiconductor die 104, 106 to desired locations, such as interconnecting semiconductor die, as indicated generally at 120, 122, and facilitating contacts to external devices/structures through external contacts 124. RDL 108 is a "fan-out" structure, redistributing contacts of semiconductor die 104, 106 to locations outside the perimeter of such die, and facilitating interconnections between the die of the MCP.

In the depicted example, each build-up layer 110, 112, 116 may be formed of a non-homogeneous PID as described in more detail later herein relative to FIG. 2. Each metal layer M1, M2, M3 may be formed of an electroless metal, for example electroless copper, deposited over a metal seed layer, as discussed in more detail relative to FIGS. 3A-3F. In examples in which the electroless metal is copper, as identified, common metals deposited as a seed layer include, for example titanium and chromium. The thickness of a deposited metal seed layer can vary significantly depending upon the specific structure and materials at issue. However a metal seed layer thickness between 10 nm and 25 nm is common, with many metal seed layer thicknesses being within the 12 nm to 17 nm range.

Figure 2:
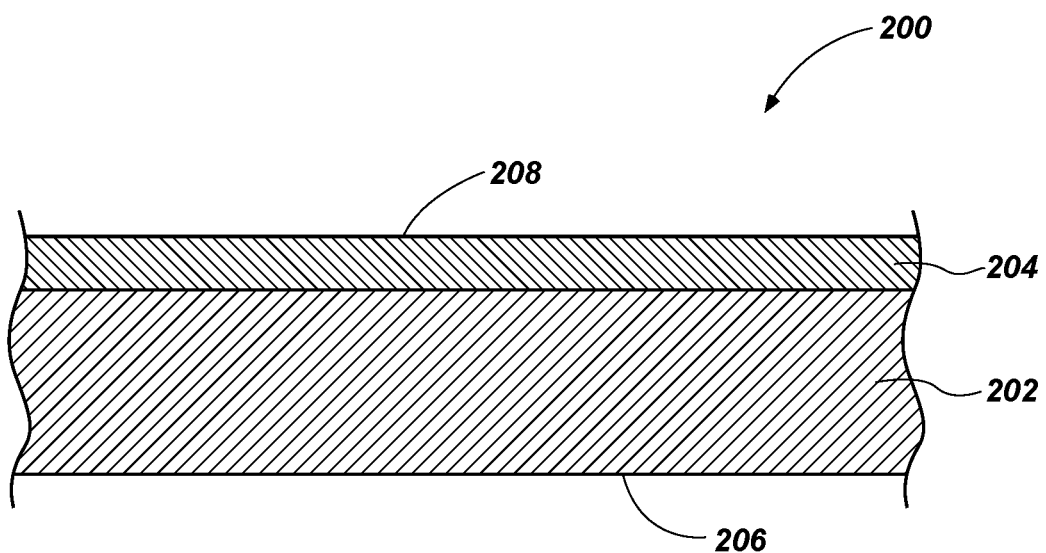
FIG. 2 depicts an example cross-section of a non-homogeneous photoimageable dielectric material.

Referring now to FIG. 2, the figure depicts an example cross-section of a non-homogeneous PID 200. In many examples, conventional PID includes an organic resin system, such as an epoxy resin. In many examples, such conventional PID is in the form of a dry film. Unlike conventional PID materials, PID 200 includes a first region 202 comprising a conventional PID material (which may be any of various PID materials known to persons skilled in the art), and a second region in which the PID material composition has been modified to include a carbon content that is greater than the carbon content in the first region. In conventional PID films, for example, the carbon content in the first region may be 50% or less; while in the second region of PID 200, the conventional film composition would be modified to provide a carbon content of at least 60%, and in some examples up to 80%.

By virtue of these two regions in non-homogeneous PID 200, it may be characterized as a bi-layer PID (without regard for the manner by which the two regions are formed). The term "bi-layer" is used herein to identify a PID having two identifiable regions of differing compositions, specifically of differing carbon content. It should be understood, however, that such term does not exclude (and expressly contemplates) a transition area between the two identifiable regions of different carbon content. Additionally, it should be understood that the composition within each of the two regions of different carbon content may not be completely homogeneous even within the region.

In some examples, a bi-layer PID 200 may be formed of two separate dry films each forming a respective region of the bi-layer PID 200 laminated together. In some such examples, the two dry films may be laminated together before use in manufacturing a substrate; and in other examples the two dry films could be laminated together in the course of manufacturing a substrate (laminating a first composition PID to form the first region, and lemonade a second composition PID to form the second region). However, for many purposes, the second region may be formed with a very limited vertical dimension, for example on the order of 1 nm to 5 nm, with 2 nm to 3 nm being satisfactory for some examples. As a result, in examples it may be desirable to form bi-layer PID 200 by a surface treatment (or other surface modification, such as a coating) of a conventional PID film.

As an example of treating a conventional organic dry film PID to form the second region of PID 200, such treating may include applying a carbon-rich treatment at a surface of the conventional PID film. Such a carbon-rich treatment, may include, for example, contacting the surface and some form with a carbon-rich compound such as, for example, any one or more of alkanes, alkenes, esthers, epoxies or carbonyl. In some examples, the carbon-rich treatment may be configured to change the composition proximate the surface of the conventional PID film; and in other examples may be a coating applied to the conventional PID film. For example, the resin forming the conventional PID film may be combined with, for example, a carbon-rich compound, such as, for example those identified above, and applied as a coating to the conventional PID film.

In some examples, a carbon-rich surface treatment may be applied as a portion of the manufacturing process for a PID film. In other examples, a carbon-rich surface treatment may be applied to a conventional PID film after manufacture and/or delivery of the conventional PID film. And in yet other examples, a carbon-rich surface treatment may be applied to a conventional PID film during the process of manufacturing of a build-up layer of a substrate. For example, a conventional PID film may be applied to an underlying structure in a conventional build-up manufacturing process; and subsequently, a carbon-rich surface treatment applied to the conventional PID material layer to form a bi-layer PID 200.

In some examples, the first region of PID 200, will extend for at least 90% of the height of PID 200. Though as noted above, for some examples, the second region of PID 200 need only extend from the upper surface of bi-layer PID 200 for a few nanometers, as discussed above. In general, it may be preferable to minimize the vertical dimension of the second region of PID 200, in that increased carbon content has the potential to adversely affect the photoimageable properties of the bi-layer PID 200.

Figure 3A:
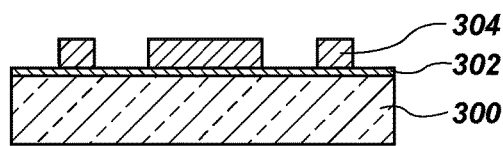
FIG. 3A-3F each depict a simplified cross-sectional representation of an example representative stage of forming multiple build-up layers for a microelectronic device substrate.
Figure 3B:
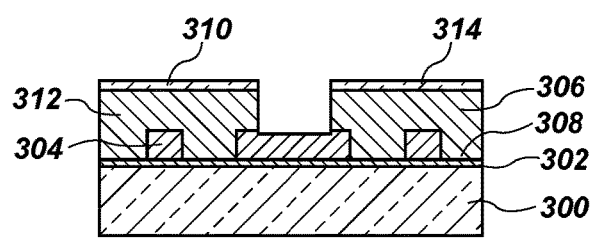

Referring now to FIGS. 3A-3F, the figures each depict a simplified cross-sectional representation of an example representative stage in forming multiple build-up layers for a microelectronic device substrate through use of a bi-layer PID as described herein. Referring first to FIG. 3A, a carrier 300, with a release layer 302 formed thereon, supports a patterned metallization layer 304 forming a first metal layer of the substrate being formed. In FIG. 3B, a bi-layer PID film 306 is formed over patterned metallization layer 304. A first surface 308 of a bi-layer PID film 306, contacting patterned metallization layer 304 and release layer 302, is defined by a first region 312 of conventional PID film composition, as discussed above. A second opposite surface 310 of PID film 306 is defined by a second region 314 of bi-layer PID film 306, and will contact a seed layer to be applied subsequently. Second region 314 of bi-layer PID film 306 may be formed, for example, in accordance with any of the example techniques discussed in reference to FIG. 2.

Figure 3C:
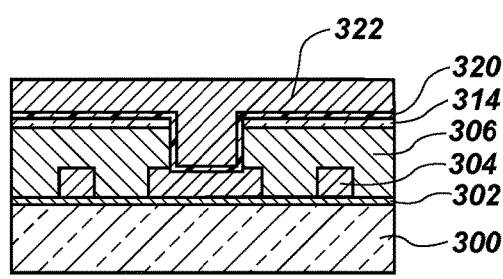
Figure 3D:
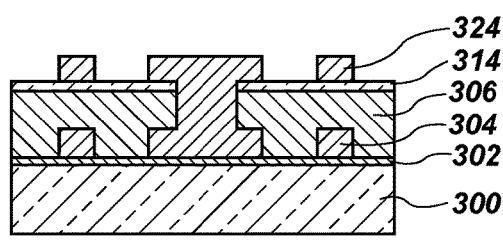

In FIG. 3C, a seed layer 320 has been deposited, for example by sputtering (i.e., one or more forms of physical vapor deposition, or "PVD"). And subsequently, the electroless metal 322 has been formed over seed layer 320. As identified previously, common example metals for seed layer 320 are titanium and chromium, when the electroless metal 322 is copper. In FIG. 3D, the electroless metal layer 322, has been patterned to define a second metal layer of the substrate being formed. For purposes of illustrating the example process, seed layer 320 is shown in place even after deposition of electroless metal 322. However, in many examples once electroless metal 322 is deposited the metal of the seed layer 320 will intermix with the electroless metal (and thus sees layer 320 is not depicted in subsequent figures).

Figure 3E:
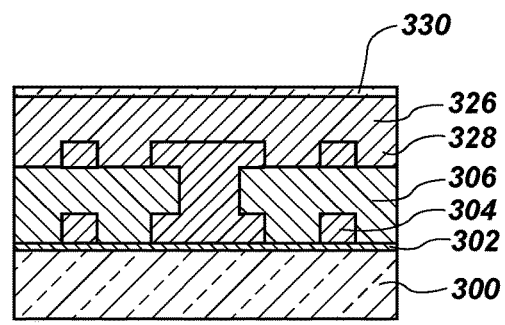
Figure 3F:
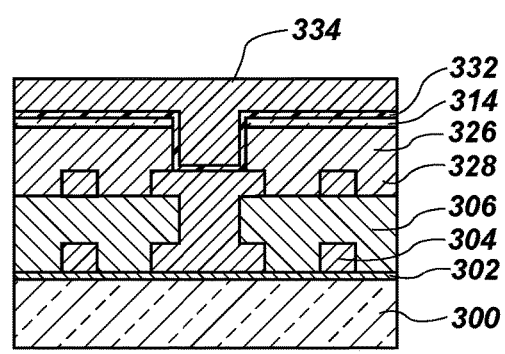

In FIG. 3E, a second bi-layer PID film 326 has been formed over the second metal layer. In many examples, bi-layer PID film 326 will be formed the same as bi-layer PID film 306, defining a first region 328 adjacent the second metallization layer, and a second region 330 above first region 328. As shown in FIG. 3F, another seed layer 332 has been deposited over bi-layer PID film 326, and another electroless metal layer 334 is been deposited over seed layer 332. Electroless metal layer 334 will be patterned to form a third metallization layer. Additional layers may be formed above the structure of FIG. 3F, in a manner that will be apparent to persons skilled in the art having the benefit of this disclosure.

Figure 4:
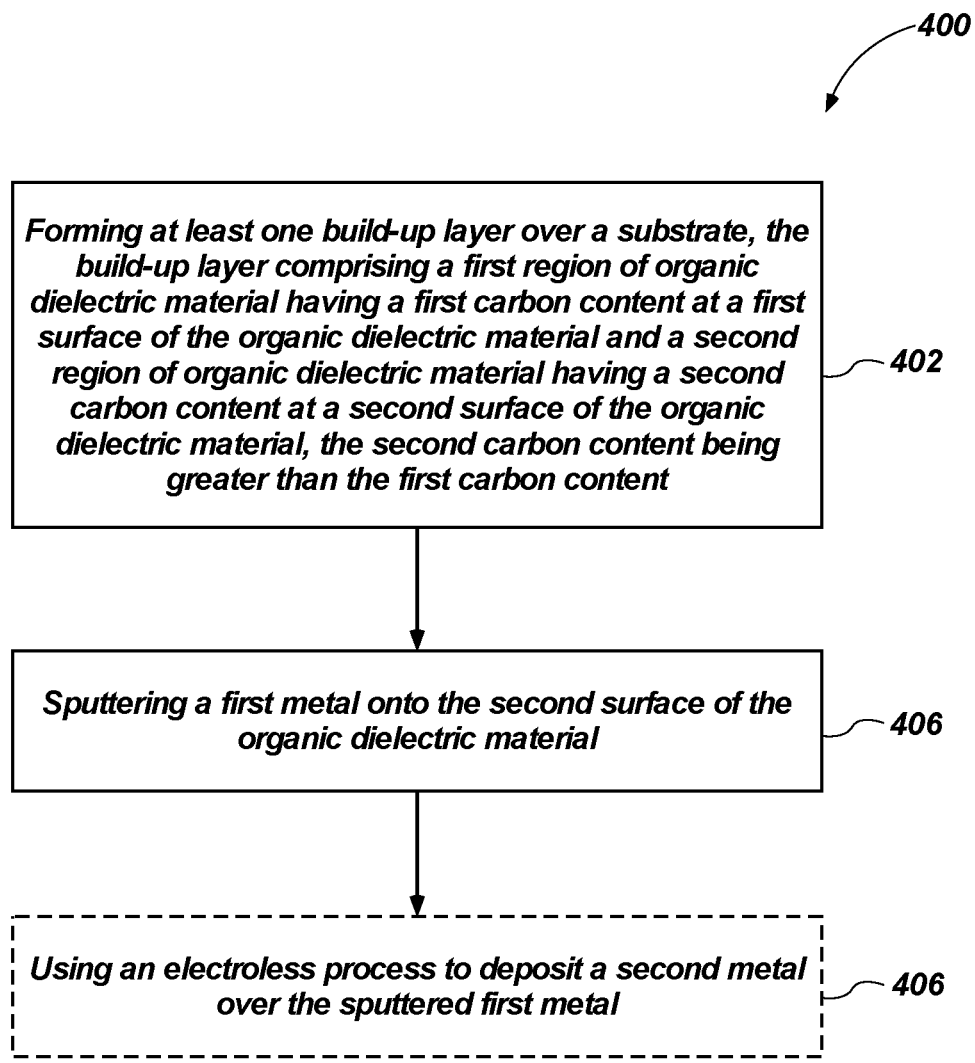
FIG. 4 is a flowchart of an example method for forming a microelectronic device substrate in accordance with the descriptions herein.

Referring now to FIG. 4, the figure is a flowchart of an example method 400 of forming a substrate for inclusion in a microelectronic device, through use of a bi-layer organic dielectric material film, such as a PID film. As indicated in 402, at least one build-up layer is formed over a substrate, wherein the build-up layer comprises first and second regions organic dielectric material. In many examples, both the first and second regions organic dielectric material will comprise a PID material (such as a PID resin system). The first region of organic dielectric material has a first carbon content, and the second region has a second carbon content greater than that of the first region. The first region defines a first surface of the organic dielectric material and the second region defines a second surface of the organic dielectric material. The bi-layer organic dielectric material film may be formed, for example, in accordance with any of the techniques discussed in reference to FIG. 2.

As indicated at 404, a first metal layer will be sputtered onto the second surface of the organic dielectric material as discussed previously herein. As discussed previously, in many examples, this first metal layer will be a seed layer for subsequent electroless deposition. In that circumstance, as indicated at 406, an optional operation of using an electroless process to deposit a second metal over the sputtered first metal will be performed. Operations 404-406 may be performed multiple times to manufacture at least a portion of a substrate, which will then be incorporated into a microelectronic device.

Figure 5:
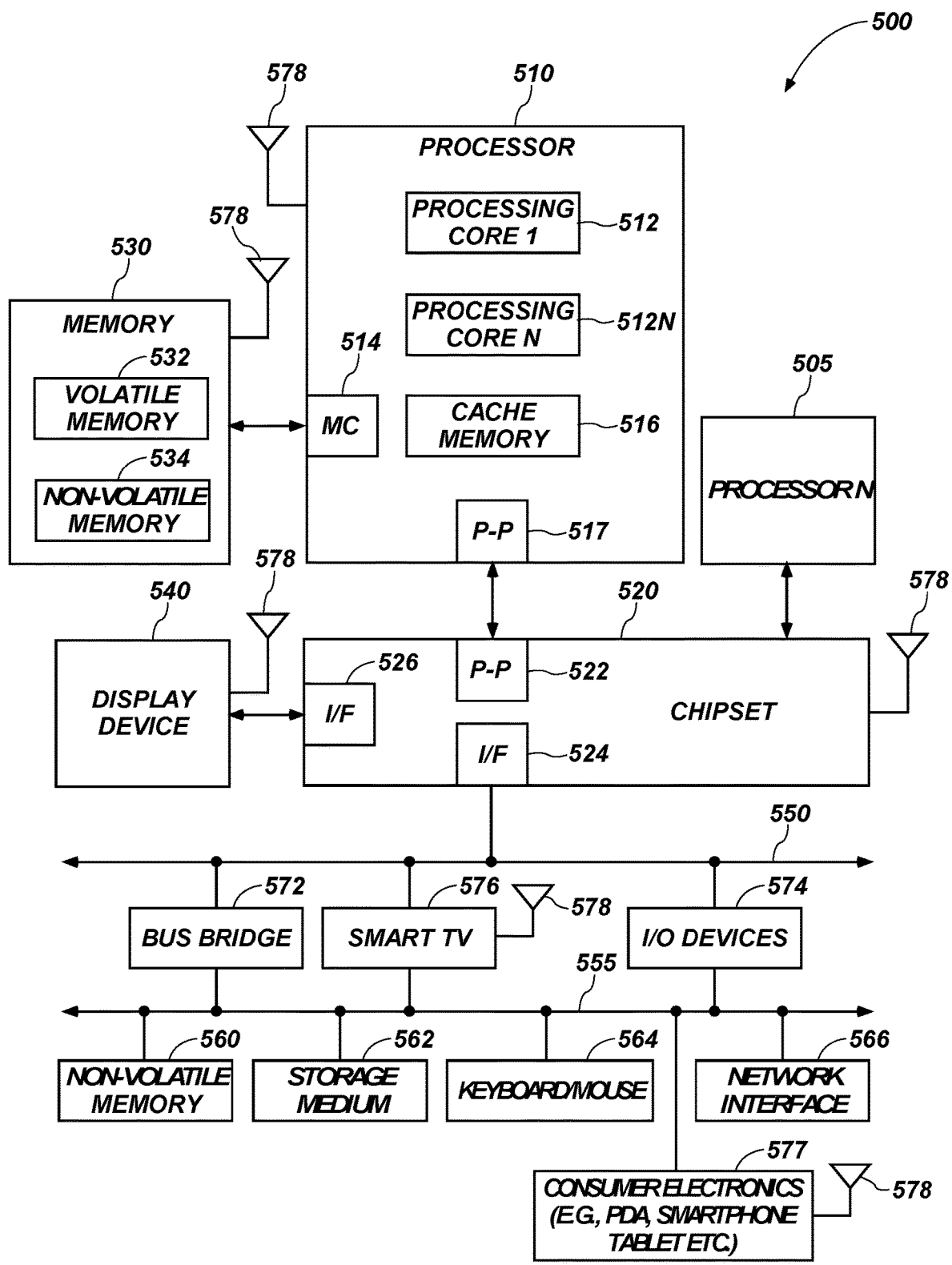
FIG. 5 depicts a system level diagram of an electronic system which may incorporate microelectronic device having a photoimageable dielectric-containing substrate formed in accordance with any of the embodiments herein.

FIG. 5 illustrates a system level diagram, according to one embodiment of the invention. For instance, FIG. 5 depicts an example of an electronic device (e.g., system) including one or more microelectronic devices including a structure, such as a substrate, manufactured with a non-homogeneous photoimageable dielectric, as discussed herein. FIG. 5 is included to show an example of a higher level device application for the present invention. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processing cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 566, 577, etc. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520 couples with a non-volatile memory 560, a mass storage device(s) 562, a keyboard/mouse 564, a network interface 566, a smart TV 576, consumer electronic(s) 577, etc. via interface 524.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

To better illustrate the methods and apparatuses described herein, a non-limiting set of Example embodiments are set forth below as numerically identified Examples.

Example 1 is a photoimageable dielectric material, comprising: a first region of photoimageable dielectric material forming a first surface of the photoimageable dielectric material, the first region having a first carbon content; a second region of photoimageable dielectric material forming a second surface of the photoimageable dielectric material, the second region having a second carbon content greater than the first carbon content.

In Example 2, the subject matter of Example 1 wherein the first region of the photoimageable dielectric material has a first vertical dimension; and wherein the second region of the photoimageable dielectric material has a second vertical dimension less than the first vertical dimension.

In Example 3, the subject matter of any one or more of Examples 1-2 wherein the first and second regions of photoimageable dielectric material form a bi-layer photoimageable dielectric material.

In Example 4, the subject matter of any one or more of Examples 2-3 wherein the first region of photoimageable dielectric material extends for at least 90% of the distance between the first surface of the photoimageable dielectric material and the second surface of the photoimageable dielectric material.

In Example 5 the subject matter of any of Examples 1-4, wherein the second region has a thickness of 5 nm or less In Example 6, the subject matter of Example 5, wherein the second region has a thickness of 4 nm or less.

In Example 7, the subject matter of any one or more of Examples 1-6 wherein the second region of the organic material is adapted to provide improved adhesion to sputtered titanium than the first region of the photoimageable dielectric material.

In Example 8, the subject matter of any one or more of Examples 1-7 wherein the second region of the photoimageable dielectric material is in the form of a coating over the first region of photoimageable dielectric material.

In Example 9, the subject matter of any one or more of Examples 1-8 wherein the second region of the photoimageable dielectric material comprises greater than 50% carbon, and wherein the first region of the photoimageable dielectric material comprises less than 50% carbon.

In Example 10, the subject matter of any one or more of Examples 1-9 wherein the second region of the photoimageable dielectric material comprises greater than 60% carbon.

In Example 11, the subject matter of any one or more of Examples 1-10 wherein the second region of the photoimageable dielectric material comprises between 60% and 80% carbon.

In Example 12, the subject matter of any one or more of Examples 3-11 wherein the photoimageable dielectric material is a dry film.

Example 13 is a method of forming a microelectronic device, comprising: forming at least one build-up layer on a supporting structure, the at least one build-up layer including, a first region of photoimageable dielectric material forming a first surface of the photoimageable dielectric material, the first region having a first carbon content, and a second region of photoimageable dielectric material forming a second surface of the photoimageable dielectric material, the second region having a second carbon content greater than the first carbon content; and sputtering a metal onto the second surface of the photoimageable dielectric material.

In Example 14, the subject matter of any one or more of Examples 9-13 wherein the structure with multiple build-up layers is a fan-out redistribution layer formed on a semiconductor die and a surrounding molded component.

In Example 15, the subject matter of any one or more of Examples 12-14 wherein sputtering a metal onto the second surface of the photoimageable dielectric material comprises sputtering titanium onto the second surface.

In Example 16, the subject matter of Example 15 forming electroless copper on the sputtered titanium to form conductive structures.

In Example 17, the subject matter of any one or more of Examples 1-16 wherein at least one build-up layer is formed by applying a bi-layer material to the supporting structure, the bi-layer material including the first and second regions of photoimageable dielectric material.

In Example 18, the subject matter of any one or more of Examples 16-17 wherein the first region of photoimageable dielectric material extends for at least 90% of the distance between the first surface of the photoimageable dielectric material and the second surface of the photoimageable dielectric material.

In Example 19, the subject matter of any one or more of Examples 17-18 wherein the second region has a thickness of 4 nanometers or less.

In Example 20, the subject matter of any one or more of Examples 17-19 wherein the second region has a thickness of 3 nanometers or less.

In Example 21, the subject matter of any one or more of Examples 1-20 wherein the second region of the organic material is adapted to provide improved adhesion to sputtered titanium than the first region of the photoimageable dielectric material.

In Example 22, the subject matter of any one or more of Examples 1-21 wherein the second region of the photoimageable dielectric material is in the form of a coating over the first region of photoimageable dielectric material.

In Example 23, the subject matter of any one or more of Examples 1-22 wherein the second region of the photoimageable dielectric material comprises greater than 50% carbon, and wherein the first region of the photoimageable dielectric material comprises less than 50% carbon.

In Example 24, the subject matter of any one or more of Examples 22-23 wherein the second region of the photoimageable dielectric material comprises greater than 60% carbon.

Example 25 is an electronic system, comprising: a processor; a microelectronic device comprising, at least one semiconductor device, and a substrate including, at least one layer comprising a photoimageable dielectric material including, a first region of photoimageable dielectric material forming a first surface of the photoimageable dielectric material, the first region having a first carbon content, and a second region of photoimageable dielectric material forming a second surface of the photoimageable dielectric material, the second region having a second carbon content greater than the first carbon content, and a metal conductor deposited over the second region of photoimageable dielectric material; and at least one of an additional semiconductor device, a mass storage device, and a network interface operably coupled to the microelectronic device.

In Example 26, the subject matter of Example 25 wherein the second region of photoimageable dielectric material has a vertical thickness 6 nanometers or less.

In Example 27, the methods of manufacturing a microelectronic device of any of Examples 13-24, are performed through use of a photoimageable dielectric material in accordance with any of Examples 1-12.

In Example 28, the subject matter of either of Examples 25 and 26 are manufactured their use of any of the methods of Examples 13-24.

In example 29, the subject matter of either of Examples 25-28 incorporate a photoimageable dielectric material in accordance with any of Examples 1-12.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "where." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method of forming a microelectronic device, comprising:
   forming at least one build-up layer on a supporting structure, the at least one build-up layer including,
   a first region of photoimageable dielectric material forming a first surface of the photoimageable dielectric material, the first region having a first carbon content, and
   a second region of photoimageable dielectric material forming a second surface of the photoimageable dielectric material, the second region having a second carbon content greater than the first carbon content; and
   sputtering a metal onto the second surface of the photoimageable dielectric material.

2. The method of forming a microelectronic device of claim 1, wherein the structure with multiple build-up layers is a fan-out redistribution layer formed on a semiconductor die and a surrounding molded component.

3. The method of forming a microelectronic device of claim 1, wherein sputtering a metal onto the second surface of the photoimageable dielectric material comprises sputtering titanium onto the second surface.

4. The method of forming a microelectronic device of claim 3, forming electroless copper on the sputtered titanium to form conductive structures.

5. The method of forming a microelectronic device of claim 4, wherein at least one build-up layer is formed by applying a bi-layer material to the supporting structure, the bi-layer material including the first and second regions of photoimageable dielectric material.

6. The method of forming a microelectronic device of claim 4, wherein the first region of photoimageable dielectric material extends for at least 90% of the distance between the first surface of the photoimageable dielectric material and the second surface of the photoimageable dielectric material.

7. The method of forming a microelectronic device of claim 1 wherein the second region has a thickness of 4 nanometers or less.

8. The method of forming a microelectronic device of claim 1 wherein the second region has a thickness of 3 nanometers or less.

9. The method of forming a microelectronic device of claim 1, wherein the second region of the organic material is adapted to provide improved adhesion to sputtered titanium than the first region of the photoimageable dielectric material.

10. The method of forming a microelectronic device of claim 1, wherein the second region of the photoimageable dielectric material is in the form of a coating over the first region of photoimageable dielectric material.

11. The method of forming a microelectronic device claim 1, wherein the second region of the photoimageable dielectric material comprises greater than 50% carbon, and wherein the first region of the photoimageable dielectric material comprises less than 50% carbon.

12. The method of forming a microelectronic device of claim 11, wherein the second region of the photoimageable dielectric material comprises greater than 60% carbon.

* * * * *